United States Patent [19]
Shinozaki et al.

[11] Patent Number: 5,247,528
[45] Date of Patent: Sep. 21, 1993

[54] SECOND HARMONIC GENERATOR USING A LASER AS A FUNDAMENTAL WAVE SOURCE

[75] Inventors: Keisuke Shinozaki; Takeshi Kamijoh, both of Tokyo, Japan

[73] Assignee: Oki Electric Industry Co., Ltd., Tokyo, Japan

[21] Appl. No.: 787,939

[22] Filed: Nov. 5, 1991

[30] Foreign Application Priority Data

Nov. 7, 1990 [JP] Japan ................................. 2-301925
Feb. 25, 1991 [JP] Japan ................................. 3-029946
Mar. 18, 1991 [JP] Japan ................................. 3-051930

[51] Int. Cl.[5] ............................................. H01S 3/10
[52] U.S. Cl. ..................................... 372/22; 359/328
[58] Field of Search ...................... 372/21, 22; 359/328

[56] References Cited

U.S. PATENT DOCUMENTS

| | | | |
|---|---|---|---|
| 4,731,787 | 3/1988 | Fan et al. | 372/22 |
| 5,038,352 | 8/1991 | Lenth et al. | 372/21 |
| 5,121,250 | 6/1992 | Shinozaki et al. | 359/328 |

FOREIGN PATENT DOCUMENTS

| | | |
|---|---|---|
| 0322847 | 7/1989 | European Pat. Off. |
| 01-134984 | 5/1989 | Japan |

OTHER PUBLICATIONS

B. Jaskorzynska et al., "Periodic Structures for phase-matching in second harmonic generation in titanium lithium niobate wave guides" *SPIE. Integrated Optical Circuit Engineering III*, vol. 651, pp. 221-227 (1986) (no month).

K. Shinozaki et al., "Self-quasi-phase-matched second-harmonic generation in the proton-exchanged LiNbO$_3$ optical waveguide with periodically domain-inverted regions," *Appl. Phys. Lett.*, vol. 59, No. 5, pp. 510-512 (Jul. 29, 1991).

D. S. Smith, et al, "Refractive Indices of Lithium Niobate" *Optics Communications*, vol. 17, No. 3 pp. 332-335, (Jun. 1976).

E. J. Lim, et al, "Blue Light Generation by Frequency Doubling In Periodically Poled Lithium Niobate Channel Waveguide" *Electronics Letters*, vol. 25, No. 11, pp. 731-732 (May 25, 1989).

Toshinori Nozawa, et al, "Optical Device Applications Of LiNbO$_3$ Single Crystals" *Oyo Butsuri (Applied Physics*, Japan), vol. 59, No. 8, pp. 996-1013.

Sasson Somekh, et al, "Phase Matching by Periodic Modulation of the Nonlinear Optical Properties" *Optics Communications*, vol. 6, No. 3 pp. 301-304, (Nov. 1972).

Shintaro Miyazawa, "Ferroelectric Domain Inversion in Ti-diffused LiNbO$_3$ Optical Waveguide" *Journal of Applied Physics*, vol. 50, No. 7, pp. 4599-4603 (Jul. 1979).

Jonas Webjorn, et al, "Fabrication of Periodically Domain-Inverted Channel Waveguides in Lithium Niobate for Second Harmonic Generation" *Journal of Lightwave Technology*, vol. 7, No. 10, pp. 1597-1600.

*Primary Examiner*—James W. Davie
*Attorney, Agent, or Firm*—Edward D. Manzo

[57] ABSTRACT

A second harmonic generator has a semiconductor laser for a fundamental wave light source. The laser includes a semiconductor laser chip and a quasi-phase matching element optically coupled together in series. The semiconductor laser chip can lase utilizing feedback of a light from the quasi-phase matching element. The quasi-phase matching element receives a laser emitted from the semiconductor laser chip and generates a second harmonic light using the laser beam as a fundamental wave light.

26 Claims, 9 Drawing Sheets

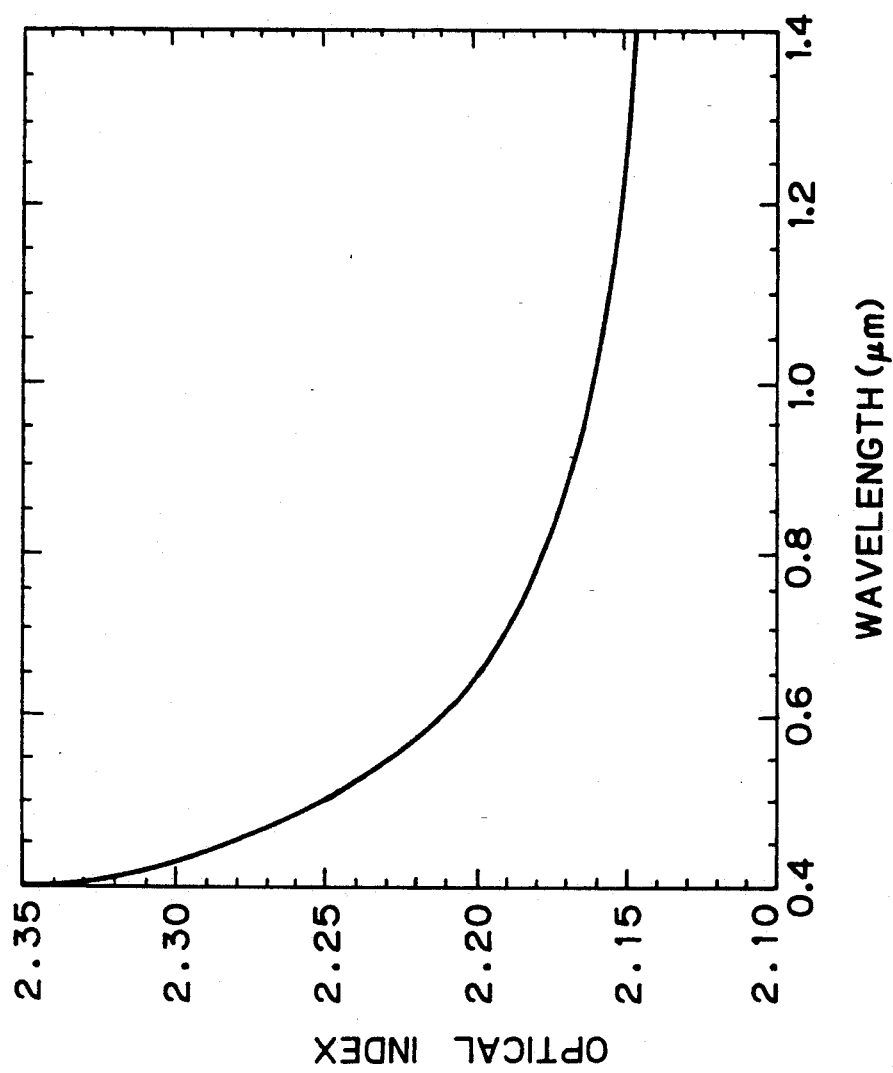

SECOND HARMONIC GENERATOR USING A LASER AS A FUNDAMENTAL WAVE SOURCE

BACKGROUND OF THE INVENTION

1. Field of the Invention

The present invention relates to a second harmonic generator using a laser as a fundamental wave light source.

2. Description of the Prior Art

This type of second harmonic generator is adapted to reduce the wavelength of an output light from a light source into half for the purpose of reduction of the wavelength. Second harmonic generating elements (also termed as SHG elements) used in such a device are disclosed in E. J. Lim, et al, "Blue Light Generation by Frequency Doubling in Periodically Polled Lithium Niobate Channel Waveguide" *Electronics Letters*, Vol. 25, No. 11, pp. 731-732 (1989).

Referring to FIG. 1, which is a schematic perspective view of a second harmonic generating element, a concept of principle of operation, or quasi-phase matching method, of the SHG element, will be described. In this SHG element, a LiNbO$_3$ substrate 10 has a +C surface in which Ti (titanium) has been thermally diffused periodically with the period of Λ at the diffusion temperature of about 1,100° C. for the diffusion time of about one hour to form a domain inversion structure 12, which is a grating-like structure. An optical waveguide 14 is formed by a proton exchange method (Li+—H+ exchange method) perpendicular to the domain inversion structure 12.

As shown in FIG. 1, a fundamental wave of an angular frequency of $\omega$ and a wavelength of $\lambda(\omega)$ is introduced from the left in the optical waveguide 14 and propagates therein in an m-th propagation mode (m=0, 1, 2, ...) at an effective guide index of refractive index Nn ($\omega$). As is well known, during this propagation a second harmonic of an angular frequency of $2\omega$ and a wavelength $\lambda(2\omega)$ is generated. In other words, a portion of energy of the fundamental wave $\omega$ is transferred to the second harmonic $2\omega$.

Now, assuming that no domain inversion region has been formed, the amount of part of energy of the fundamental wave converted to the second harmonic becomes maximal when the fundamental wave propagates in the optical waveguide 14 by a length lc (coherence length) given by the following formula:

$$lc = \lambda(\omega)/[4\{Nn(2\omega) - Nm(\omega)\}] \quad (1)$$

wherein Nn(2$\omega$) is the effective guide index for n-th propagation mode of the second harmonic, and Nm($\omega$) is the effective guide index for m-th propagation mode of the fundamental wave.

Hereafter, description will be made on a case where both the fundamental wave and the second harmonic propagate in zeroth (0-th) mode or fundamental modes, i.e., m=n=0, for simplicity. Here, coherence length lc depends on the fundamental wavelength $\lambda(\omega)$ and the size of the optical waveguide. When $\lambda(\omega) = 860$ nanometers (nm) and the thickness of the optical waveguide is on the order of d=1 micron, the amount lc is said to be on the order of 1.7 micron or micrometer ($\mu$m). See Toshinori Nozawa, et al, "Optical-Device Applications of LiNbO$_3$ Single Crystals" Oyo Butsur (Applied Physics, Japan), Vol. 59, No. 8, pp. 996-1013 (1990), Table 3). This value was obtained on the assumption that the deviation of the coherence length lc from a true value would not be so large if the coherence length lc is calculated from the fact that the guide index n(860) of a light having a wavelength of 0.860 micron from LiNbO$_3$ is on the order of 2.1723 and the guide index n(430) of a light of a wavelength of 0.430 micron is on the order of 2.2987. See D. S. Smith, et al, "Refractive Indices of Lithium Niobate" *Optics Communications*, Vol. 17, No. 3, p. 332 (1976), using the value of n(860) as Nm($\omega$) and the value of n(430) as Nn(2$\omega$).

The coherence length lc being 1.7 micron means that the intensity of the second harmonic becomes maximal as the fundamental wave propagates in the optical waveguide 14 by a length of 1.7 microns, and then becomes 0 (zero) as it propagates by a further length of 1.7 microns. In other words, the fact that the coherence length lc is finite rather than infinite indicates that phase matching between the fundamental wave and the second harmonic is incomplete, and that if the fundamental wave propagates in the optical waveguide 14 over a distance longer than the coherence length lc, the intensity of the second harmonic will not exceed a certain value.

The incomplete phase matching means a presence of phase mismatching. This phase mismatching $\Delta k$ is given by the following formula:

$$\Delta k = (4\pi/\lambda(\omega))(N(2\omega) - N(\omega)).$$

Accordingly, as shown in FIG. 1, a domain inversion region 12 is provided for every coherence length lc to form a grating-like structure of domain inversion region 12 at a period of $\Lambda(=2\,lc)$ so that phase mismatching $\Delta k$ can be supplemented to enable outputting a second harmonic having an intensity proportional to substantially a second power of the distance in which the fundamental wave propagated.

The condition under which the phase mismatching is supplemented completely is given the following equation:

$$N(2\omega) - N(\omega) - \lambda(2\omega)/\Lambda = 0 \quad (2)$$

See, Sasson Somekh, et al, "Phase Matching by Periodic Modulation of Nonlinear Optical Properties" *Optics Communications*, Vol. 6, No. 3, pp. 301-304 (1972), particularly formula (12) in the literature, for example.

Jonas Webjorn, et al, "Fabrication of Periodically Domain-Inverted Channel Waveguides in Lithium Niobate for Second Harmonic Generation" *Journal of Lightwave Technology*, Vol. 7, No. 10, pp. 1597-1600 (1989) recites this formula as it is. Even when a strict phase matching (N(2$\omega$) − N($\omega$) − $\lambda(2\omega)/\Lambda$ = 0) is not obtained, the formation of a periodical domain inversion structure which satisfies formula (2) makes it possible to take out a second harmonic (or SH light output) whose intensity is proportional to output or develop the second power of the distance of propagation of the fundamental wave, and thus of the length L of the SHG element.

However, the condition given by formula (2) is difficult to attain for the following two reasons: (1) Effective guide indices N(2$\omega$) and N($\omega$) depend on the dimension of the optical waveguide used and the precision of dimension required here cannot be attained sufficiently with current state of technology; and (2) The precision of dimension of period $\Lambda$ must be 1 nm or less but such precision of dimension cannot be attained sufficiently currently.

Then, use is made of a dye laser whose wavelength is variable for a light source for the fundamental wave in order to satisfy formula (2) so that conversion efficiency can be increased. See E. J. Lim et al, *Electronics Letters*, Vol. 25, No. 11, pp. 731-732 (1989).

However, the use of a dye laser for the light source for the fundamental wave leads to increased size of the overall second harmonic generator, and the second harmonic generator using a dye laser for the light source for the fundamental wave is of substantially no practical use because a monochromatic laser light is already available by gas laser or the like.

SUMMARY OF THE INVENTION

Under the circumstances, the present inventors have made various studies and experiments and as a result have now found that a practically useful second harmonic generator can be constructed using a semiconductor laser (hereafter, abbreviated as SL) more compact than the dye laser for the fundamental wave light source and adopting a technology making an oscillation wavelength variable.

Therefore, it is an object of the present invention to provide a second harmonic generator which is compact, uses a semiconductor laser for a fundamental wave light source and a second harmonic generating element based on a quasi-phase matching method and can produce a high power, short wavelength laser beam.

In one aspect of the present invention, in order to achieve the aforementioned and other objects, a second harmonic generator comprises a semiconductor laser chip having an active layer therein acting as a semiconductor laser for a fundamental wave light source for emitting a laser light, and a quasi-phase matching element optically coupled to the semiconductor laser chip to allow said semiconductor laser chip to lase utilizing feedback of a light from said quasi-phase matching element. The quasi-phase matching element is adapted to generate a second harmonic light using the laser light emitted from said semiconductor laser chip as a fundamental wave light.

Here, the quasi-phase matching element may preferably comprise an optical waveguide having a periodical guide index distribution structure.

The semiconductor laser chip may preferably have a first chip end and a second chip end each of which is capable of emitting a light, in which the second chip end of the semiconductor laser chip is an end on which the semiconductor laser chip is optically coupled with the quasi-phase matching element, and the first chip end of the semiconductor laser chip and the periodical guide index distribution structure of the quasi-phase matching element may constitute an external optical resonator for lasing the semiconductor laser chip.

In another aspect of the present invention, the second harmonic generator may further comprise a structure for lasing of the semiconductor laser chip utilizing feedback of a light from the periodical guide index distribution structure. In this case, the semiconductor chip and the quasi-phase matching element may preferably be arranged so that the feedback of the light from the optical waveguide in the quasi-phase matching element is made into the active layer in the semiconductor laser chip.

In a further aspect of the present invention, the semiconductor laser chip may preferably have a first chip end and a second chip and each of which is capable of emitting a light, in which the second chip end of the semiconductor laser chip is an end on which the semiconductor laser chip is optically coupled with the quasi-phase matching element, in which the first chip end of the semiconductor laser chip has provided thereon a first (higher) reflection coating film constituting an external optical resonator for lasing of the semiconductor laser chip; and in which the second chip end of the semiconductor laser chip has provided thereon a second (lower) reflection coating film free of contribution to the lasing of the semiconductor laser chip.

The periodical guide index distribution structure may preferably have a reflection effect on the fundamental wave light.

Further, the periodical guide index distribution structure may preferably have a transmission effect on the second harmonic light.

The periodical guide index distribution structure may preferably have a period of variation of a guide index satisfying:

(i) conditions of quasi-phase matching of the quasi-phase matching element;
(ii) conditions of reflection of the fundamental wave light; and
(iii) conditions of transmission of the second harmonic light.

Preferably, the condition of quasi-phase matching may be:

$$\Lambda/2 = Lc = (2s-1)\lambda(\omega)/4\{N(\omega)-N(\omega)\}$$

wherein
s is a positive integer,
$\Lambda$ is a period of variation of the guide index in the periodical guide index distribution structure,
Lc is a length that is an odd number multiple larger than the coherence length of the fundamental light in the quasi-phase matching element.
$\lambda(\omega)$ is a wavelength of the fundamental wave light,
$N(\omega)$ is an effective guide index of the optical waveguide for the fundamental wave light, and
$N(2\omega)$ is an effective guide index of the optical waveguide for the second harmonic light.

The quasi-phase matching element may preferably comprise a LiNbO$_3$ substrate having a +C surface, an optical waveguide formed on the +C surface of the substrate by a Li+ — H+ proton exchange method, and a periodical guide index distribution structure formed in the optical waveguide by Ti diffusion.

The quasi-phase matching element may preferably have a first element end capable of introduction and emission of the fundamental wave light, and a second element end capable of introduction and emission of the second harmonic light. In this case, each of the first and second element ends may have a second reflection coating film to keep reflection of the fundamental wave light and the second harmonic light to respective predetermined (low) levels.

The second harmonic generator may preferably have a ½ wavelength plate inserted between the semiconductor laser chip and the quasi-phase matching element.

The active layer of the semiconductor layer chip and the optical waveguide of the quasi-phase matching element may preferably be optically coupled with each other.

Preferably, the quasi-phase matching element may be of a planar type or of an optical fiber type.

The semiconductor laser chip may preferably be driven or enabled with a range of current which would, if applied to the semiconductor laser chip alone, not result in lasing the laser chip.

The quasi-phase matching element may preferably comprise a crystal substrate having a +C face as a surface, in which the quasi-phase matching element has a first element end on a side of the semiconductor laser chip, the first element end being capable of introduction and emission of the fundamental wave light, and a second element end opposite to the first element end capable of introduction and emission of the second harmonic light, in which the optical waveguide extends between the first and second element ends, the first and second element ends being inclined at interior angles Θ1 and Θ2, respectively, with respect to the +C face, and in which the semiconductor laser chip and the quasi-phase matching element are arranged so that the fundamental wave light can be incident into the optical waveguide at Brewster angle or an angle approximate thereto.

The interior angles Θ1 and Θ2 may preferably satisfy Θ1=Θ2.

The crystal substrate may include a substrate layer in which material of the crystal substrate remains unchanged, in which the optical waveguide and the substrate layer define therebetween an interface, the interface being parallel to the +C face; and in which the interior angle Θ1 is set up at a value at which the fundamental wave light and the second harmonic light in the optical waveguide can enter the interface and the +C face at a total reflection angle.

Preferably the interior angle Θ1 may satisfy conditions:

$\theta_1 = \arctan n_2$ $\Theta_1 > \arcsin(n_3/n_2) - \arcsin\{(1/n_2)\sin(\arctan n_2)\}$; and $\Theta < 180° - \arcsin(n_3/n_2) - \arcsin\{(1/n_2)\sin(\arctan n_2)\}$ where
$\theta_1$ is the Brewster angle,
$n_2$ is a guide index of the optical waveguide for the fundamental wave light, and
$n_3$ is a guide index of the material of the crystal substrate for the fundamental light.

The interior angle Θ1 may satisfy an expresion of $49.2° < \Theta_1 < 83.3°$, when the fundamental wave light has a wavelength of 830 nm.

The first and second element ends and the +C face may preferably define respective edges parallel to each other.

The condition of quasi-phase matching may be $\Lambda/2 = L(\omega) = p\lambda(\omega)/4N(\omega)$, where
p is a positive integer,
$\Lambda$ is a period of variation of the guide index in the periodical guide index distribution structure,
$L(\omega)$ is an odd multiple of the coherence length for the fundamental wavelength $\lambda(\omega)$,
$\lambda(\omega)$ is a wavelength of the fundamental wave light, and
$N(\omega)$ is an effective guide index of the optical waveguide for the fundamental wave light.

The condition of transmission of the second harmonic light may be $\Lambda/2 = L(2\omega) = (2q-1)\lambda(\omega)/8N(2\omega)$ where
q is a positive integer,
$\Lambda$ is a period of variation of the guide index in the periodical guide index distribution structure,
$L(2\omega)$ is an odd multiple of the coherence length for the wavelength $\lambda(2\omega)$ of the second harmonic light,
$\lambda(2\omega)$ is a wavelength of the second harmonic light, and
$N(2\omega)$ is an effective guide index of the optical waveguide for the second harmonic light.

The crystal substrate may include a substrate layer in which material of the crystal substrate remains unchanged, in which the optical waveguide and the substrate layer define therebetween an interface, the interface being parallel to the +C face, and in which the interior angle Θ1 is set up at a value at which the fundamental wave light and the second harmonic light in the optical waveguide can enter the interface and the +C face at a total reflection angle.

According to the present invention, a semiconductor laser is used instead of a dye laser which has been used conventionally, and a laser beam from the semiconductor laser is launched into a quasi-phase matching element as a light of a fundamental wave, resulting in a second harmonic of the fundamental wave being emitted from the quasi-phase matching element. Therefore, the whole structure of the second harmonic generator is more compact and smaller than the conventional one using a dye laser.

As described above, usually, the quasi-phase matching element includes a substrate and an optical waveguide formed on the surface thereof. In the optical waveguide is formed periodically a domain inversion region. The domain inversion regions thus formed each have a refractive index slightly higher than the remaining part of the optical waveguide. This construction may be deemed as forming a diffraction grating along the direction of optical guiding when the optical waveguide is viewed as a whole. Therefore, the domain inversion regions form a periodical guide index distribution structure.

Hence, if a semiconductor laser chip and a quasi-phase matching element are coupled together so that the periodical guide index distribution structure and the end of the semiconductor laser chip opposite to the end at which the optical connection is made can make an external optical resonator, lasing of the semiconductor chip will take place due to optical feedback from the periodical guide index distribution structure. In this case, if the periodical guide index distribution structure is constructed such that the period of guide index variation, i.e., period of formation of domain inversion regions satisfies the following three conditions:
(i) that light of fundamental wave is reflected;
(ii) that light of second harmonic is transmitted; and
(iii) a quasi-phase matching condition is met,
then the amount of light fed back from the periodical guide index distribution structure to the semiconductor chip increases, and this fedback light causes lasing. In addition, since the condition of quasi-phase matching is met, the intensity of second harmonic light increases at every coherence length. Furthermore, the second harmonic light is emitted from the quasi-phase matching element in a high power since the second harmonic light is transmitted through the periodical guide index distribution structure.

In the case of arrangement in which the light of fundamental wave from the semiconductor chip is incident at a first element end of the quasi-phase matching element so that Brewster conditions can be met, there is no fear that light reflected at the first element end serving as both incident and emerging ends will come back to the semiconductor chip, which makes it possible to activate the laser efficiently in the semiconductor chip by only the light fed back from the periodical guide index distribution structure in the optical waveguide. Since reflected light is in a negligible amount even at an incident angle near the Brewster angle, it is easy to align the semiconductor laser chip with the quasi-phase matching element.

BRIEF DESCRIPTION OF THE DRAWINGS

The above and other objects, effects, features and advantages of the present invention will become more apparent from the following description of embodiments thereof taken in conjunction with the accompanying drawings, in which:

FIG. 5 is a graph plotting a guide index-wavelength dispersion characteristics of $LiNbO_3$ used for a substrate in a quasi-phase matching element according to one embodiment of the present invention, with the horizontal axis indicating wavelength in microns and the vertical axis giving the refractive index;

DESCRIPTION OF PREFERRED EMBODIMENTS

Hereafter, the present invention will be described in greater detail with reference to the attached drawings, in which shapes, sizes and arrangements of components are indicated schematically and emphasized enough to be helpful to understand the present invention.

Figure 2:
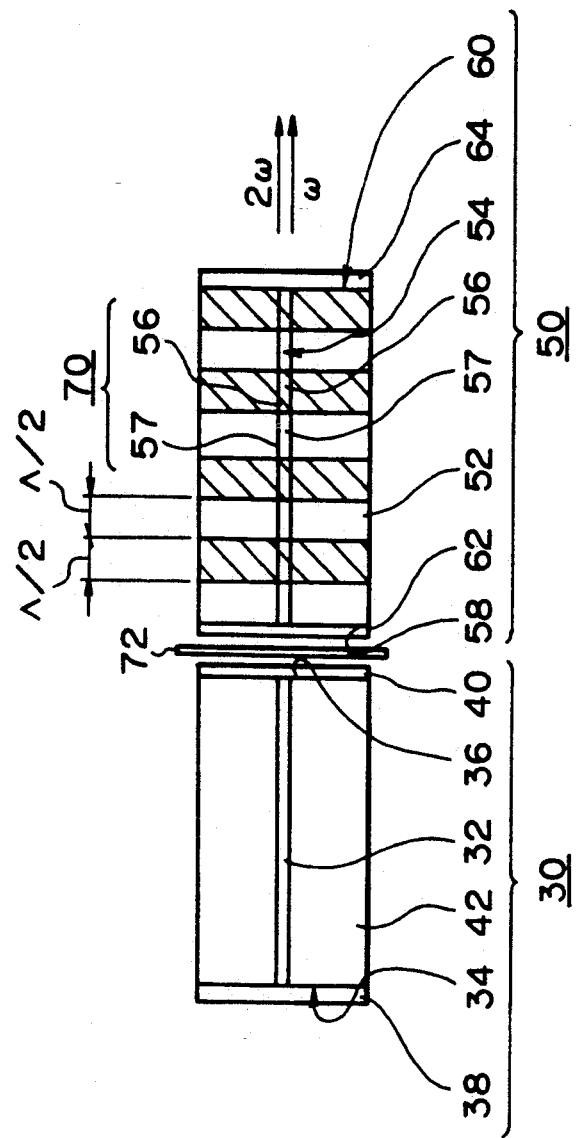
FIG. 2 is a schematic cross sectional view of a second harmonic generator according to one embodiment of the present invention.

FIG. 2 is a schematic cross sectional view of a second harmonic generator according to one embodiment of the present invention, The second harmonic generator is an apparatus utilizing a semiconductor laser for a fundamental wave light source, and hence the second harmonic generator of the present invention includes a semiconductor chip (hereafter, sometimes referred to simply as SL chip) 20 and a quasi-phase matching element (hereafter, sometimes referred to simply as SHG element) 50 optically connected to one another. This construction permits the quasi-phase matching element 50 to generate and emit light of second harmonic using a laser beam emitted from the semiconductor laser chip 30 as a fundamental wave light.

First, the semiconductor laser chip will be described in greater detail. The semiconductor laser chip 30 includes an active layer 32 which emits light and serves as an optical wave guide. Both radiation ends of the active layer 32 are substantially perpendicular to the direction in which light is guided, and these ends are termed as a first chip end 34 and a second chip end 36. A peripheral semiconductor region around the active layer 32 in indicated by 42.

Usually, the semiconductor chip has a coating film formed at the radiation ends thereof so that the radiation ends on which the laser beam is reflected can establish a predetermined reflectivity (for example, about 30%). For this reason, the semiconductor chip can lase alone without being combined with any quasi-phase matching element—unlike the instant embodiment of the present invention. In this case, however, ordinary semiconductor chips used alone for lasing have respective oscillation wavelengths fixed to ones specific to the chips.

In the present invention it is required to optically connect the semiconductor laser 30 to the quasi-phase matching element 50 and activate the laser chip for the radiation of a second harmonic at a high power from the element 50 efficiently. In order to achieve this, the semiconductor laser chip 30 is adapted to lase at a wavelength of a fundamental wave light satisfying quasi-phase matching conditions of the quasi-phase matching element 50. Therefore, a usually employed laser chip lasing alone cannot be used for the laser chip 30 in the present invention.

Thus, the semiconductor laser chip 30 included in the present invention is used in an operation current range in which no lasing will occur by itself although light emission occures in the active layer 32. In order to be useful in such an operation current range, according to the present invention, it is preferred that a high reflection coating film (hereafter, sometimes referred to simply as HR coating film) 38 contributing to lasing be provided on the first chip end 34 while on the second chip end 36 be provided a low reflection coating film (hereafter, sometimes referred to simply as AR coating film) 40 which does not contirbute to lasing to obtain a construction which will not permit the oscillation of LD chip 30 by itself.

Here, the HR and AR coating films 38 and 40 mean that they are highly and lowly reflective, respectively, for both wavelengths of the laser light (fundamental wave light, also referred to simply as fundamental wave or fundamental light) and of the second harmonic (also referred to as SH light) which will be discussed later on. The reflectivity of the HR coating film 38 is desirably 100% in ideal cases but it is suitable that it is as close thereto as possible. On the other hand, the reflectivity of the AR coating film 40 is desirably 0%. It is also suitable that it is as close thereto as possible.

Although precise wavelengths of the fundamental wave light and of SH light are unknown in the step of practicing the coating treatments, it is sufficient to set up respective wavelengths to values so that high reflection and low reflection conditions, respectively, can be satisfied for respective wavelengths of fundamental wave light and of SH light predetermined in the step of designing the quasi-phase matching element 50 discribed later. More strictly, it is sufficient to provide a plurality of LD chips and of quasi-phase matching elements subjected to some kinds of coating treatments satisfying the aforementioned high and low reflection conditions at a wavelength near one predetermined in the step of designing (particularly low reflection condition), arrange them on a proper common substrate, not shown, and integrate them by hybridization, and choose in this stage optimum combinations.

Next, we turn to a description of the quasi-phase matching element. The quasi-phase matching element 50 used in the present invention may basically be of the same construction as the conventional planar type quasi-phase matching element described above. In the instant embodiment, description will be made of the case where there is used a quasi-phase matching element 40 of a planar type. The element 50 has an optical waveguide 54 on a surface of a substrate 52. The optical waveguide 54 has domain inversion regions 56 formed therein periodically in the guide direction. In the embodiment shown in FIG. 2, each domain inversion region 56 is formed in the substrate 52 across the optical waveguide 54. In FIG. 2, regions in which domains are not inverted (domain non-inverted regions) are designated by reference numeral 57. Both ends of the optical waveguide 54 are substantially perpendicular to the direction of light guiding, and are named a first element end 58 and a second element end 60. In the instant embodiment, preferably the first and second element ends 58 and 60 may be formed with low reflection (AR) coating films 62 and 64, respectively, so that reflection losses can be minimized upon entrance and emission of laser beam.

Figure 3A:
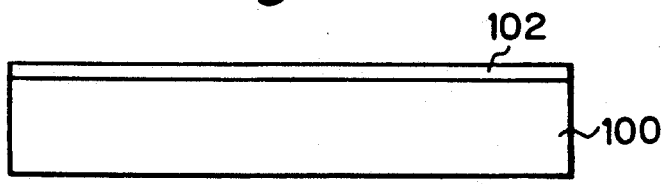
FIG. 3A is a cross sectional view of a substrate on which an optical waveguide is formed.
Figure 3B:
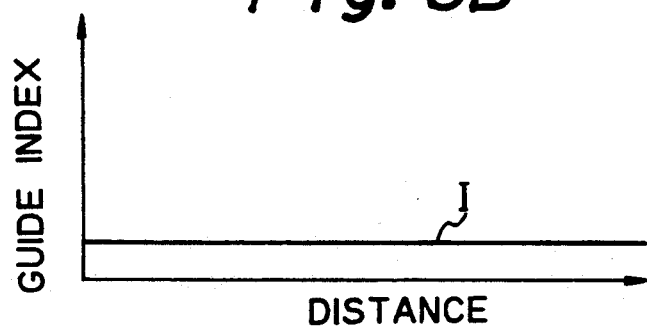
FIG. 3B is a graph in which correspondingly plotted is an example of the distribution of a guide index of the optical waveguide shown in FIG. 3A.
Figure 4A:
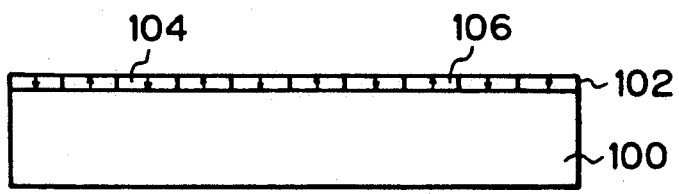
FIG. 4A is a cross-sectional view of a substrate on which an optical waveguide is formed, showing domain inversion regions formed in the optical waveguide.
Figure 4B:
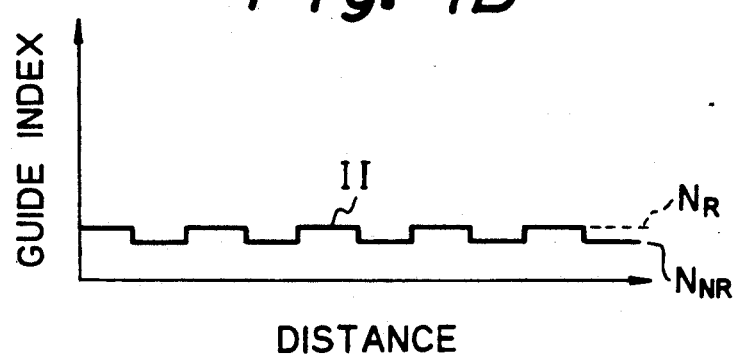
FIG. 4B is a graph in which an example of the distribution of a guide index of the optical waveguide having domain inversion regions is correspondingly plotted.

Next, referring to FIGS. 3A and 3B and FIGS. 4A and 4B, discussion will be made of the quasi-phase matching element 50, taking an example in which the substrate 52 for the quasi-phase matching element 50 is made of lithium niobate ($LiNbO_3$). FIG. 3A is a cross sectional view of a substrate on which an optical waveguide is formed, and FIG. 3B is a graph correspondingly plotting the distribution of a guide index of the optical waveguide shown in FIG. 3A. FIG. 4A is a cross sectional view of a substrate on which an optical waveguide is formed, showing domain inversion regions formed in the optical waveguide, and FIG. 4B is a graph also correspondingly illustrating the distribution of a guide index of the optical waveguide having domain inversion regions.

First, description will be made of a quasi-phase matching method. It is assumed that a fundamental wave propagates in a material which does not satisfy strict phase matching conditions (here corresponding to the case where SH light is to be obtained from an optical waveguide in a $LiNbO_3$ crystal using a nonlinear optical constant d33). In this case, the intensity of the SH light take a maximum value and a minimum value ($=0$) alternately and repeatedly as the fundamental light propagates by every coherence length lc(lc is given by formula (1) above). Hence, if the sign of a polarized wave (second harmonic) generated can be inverted alternately by every coherence length lc by any appropriate method, SH light output can be increased monotonically with respect to distance of propagation of the fundamental light. A phase matching method based on this concept may be said to be a quasi-phase matching method.

As described previously, a planar type quasi-phase matching element includes a $LiNbO_3$ substrate 100 on which an optical waveguide 102 is formed by a proton exchange method or the like, FIG. 3A. The guide index of the optical waveguide 102 is higher than that of the substrate 100 itself, and is constant from one end to another of the optical waveguide 102 as plotted with a solid line I in FIG. 3B.

The polarized wave described above is induced in a $LiNbO_3$ crystal, particularly, in an optical waveguide formed on +C surface of the $LiNbO_3$, by photoelectric field of the fundamental light. It is known that the sign of the induced polarized wave can be inverted by inverting the domain in the crystal. See E. J. Lim et al, *Electronic Letters*, vol. 25, No. 11, pp. 731-732 (1989).

On the other hand, as already described above, it is known that the domain inversion region 104 on the +C surface of the $LiNbO_3$ substrate 100 is formed by diffusing Ti at a temperature on the order of 1,100° C. See Shintaro Miyazawa, "Ferroelectric Domain Inversion in Ti-diffused $LiNbO_3$ Optical Waveguide" *Journal of Applied Physics*, vol. 50, No. 7, pp. 4599-4603 (1979). However, the Ti diffusion concentration used here is about 1/10 as low compared with the diffusion concentration of Ti diffused upon the formation of an optical waveguide by diffusion of Ti on the $LiNbO_3$ substrate 100.

However, as shown in FIG. 4A, when the domain inversion regions 104 are formed by diffusion of Ti in the optical waveguide 102 in the $LiNbO_3$ substrate 100 in a constant period, the guide index of the domain inversion regions 104 becomes higher, though slightly, then that of the domain non-inversion regions 106, where domains have not been inverted, of the optical waveguide 102 even in a Ti diffusion concentration which will cause domain inversion. The state of variation or distribution of the guide index of the optical waveguide 102 is shown with a solid line in FIG. 4B. Therefore, this periodical domain inversion structure can be deemed as a diffraction grating whose guide index varies in the same period as that of the domain inversion structure. That is, the fundamental light and SH light propagating in the quasi-phase matching element are under optical effects such as reflection or transmission by the diffractive grating. In this sense, it can be said that the periodical domain inversion structure in the quasi-phase matching element constitutes a periodical guide index distribution structure.

The second harmonic generator of the present invention has a construction positively utilizing such a periodical guide index distribution structure formed in the optical waveguide. Then, in order to positively utilize the periodical guide index distribution structure, in the instant embodiment of the present invention, the periodical guide index distribution structure is formed as a structure which strongly reflects the fundamental wave, and the HR coating film 38 (the first chip end 34) of the LD chip 30 shown in FIG. 2 and the periodical guide index distribution structure are combined to form an external laser resonator to enable lasing. The oscillation wavelength of the LD chip 30 is unequivocally determined by the period of variation of guide index of the periodical guide index distribution structure 70.

If the wavelength of the oscillated light is made equal to the wavelength of the fundamental light of the quasi-phase matching element 50 and the period of variation of guide index (periodical structure) is set up, then the quasi-phase matching element 50 satisfies its quasi-phase matching conditions completely and SH light can be extracted at a high efficiency.

Figure 6:
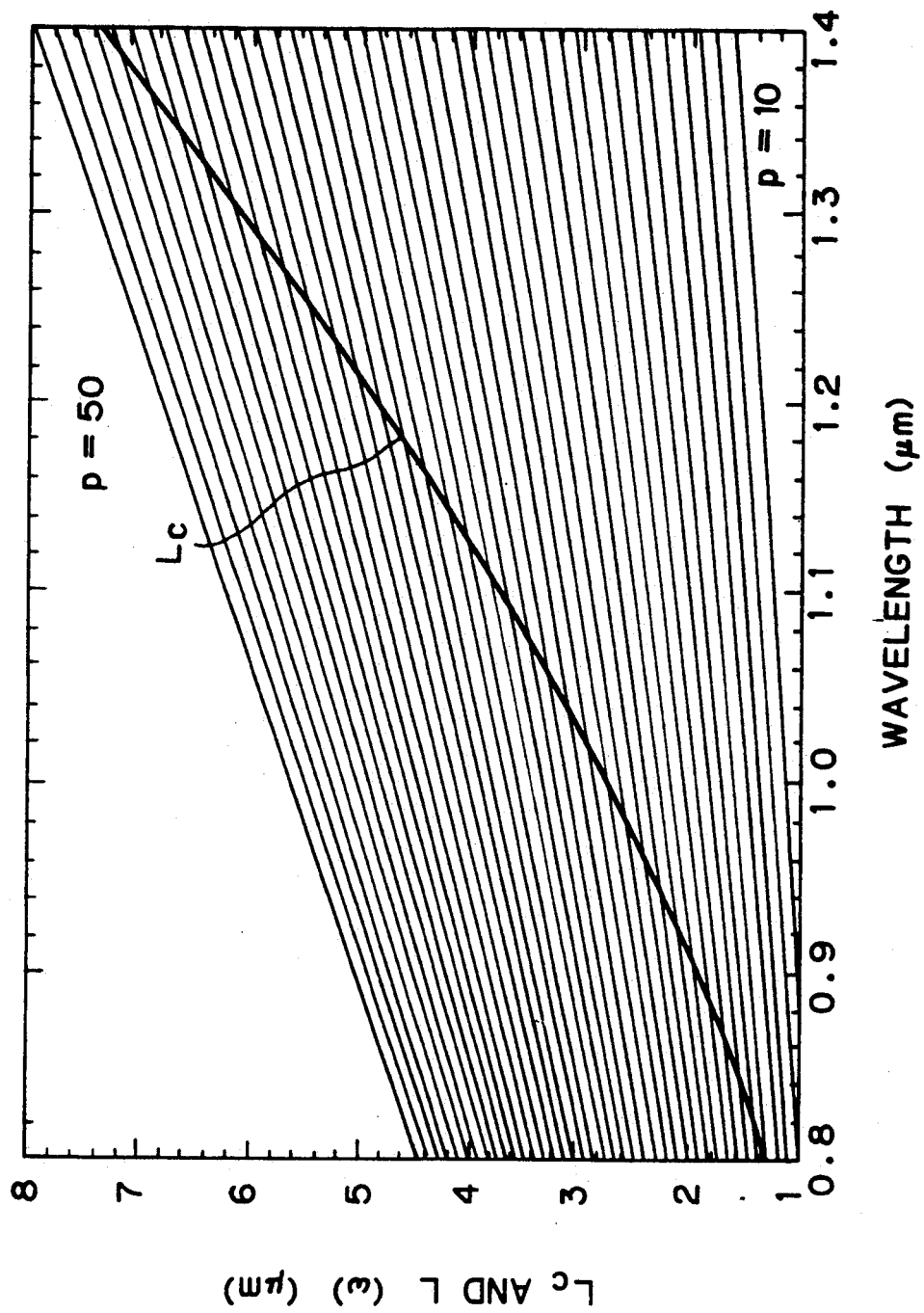
FIG. 6 is a graph illustrating a relationship between wavelength of a fundamental wave light (fundamental light) vs. length Lc which is an odd multiple laser than the coherence length lc and $L(\omega)$, with horizontal axis indicating wavelength in microns and vertical axis $L(\omega)$ in microns.
Figure 7:
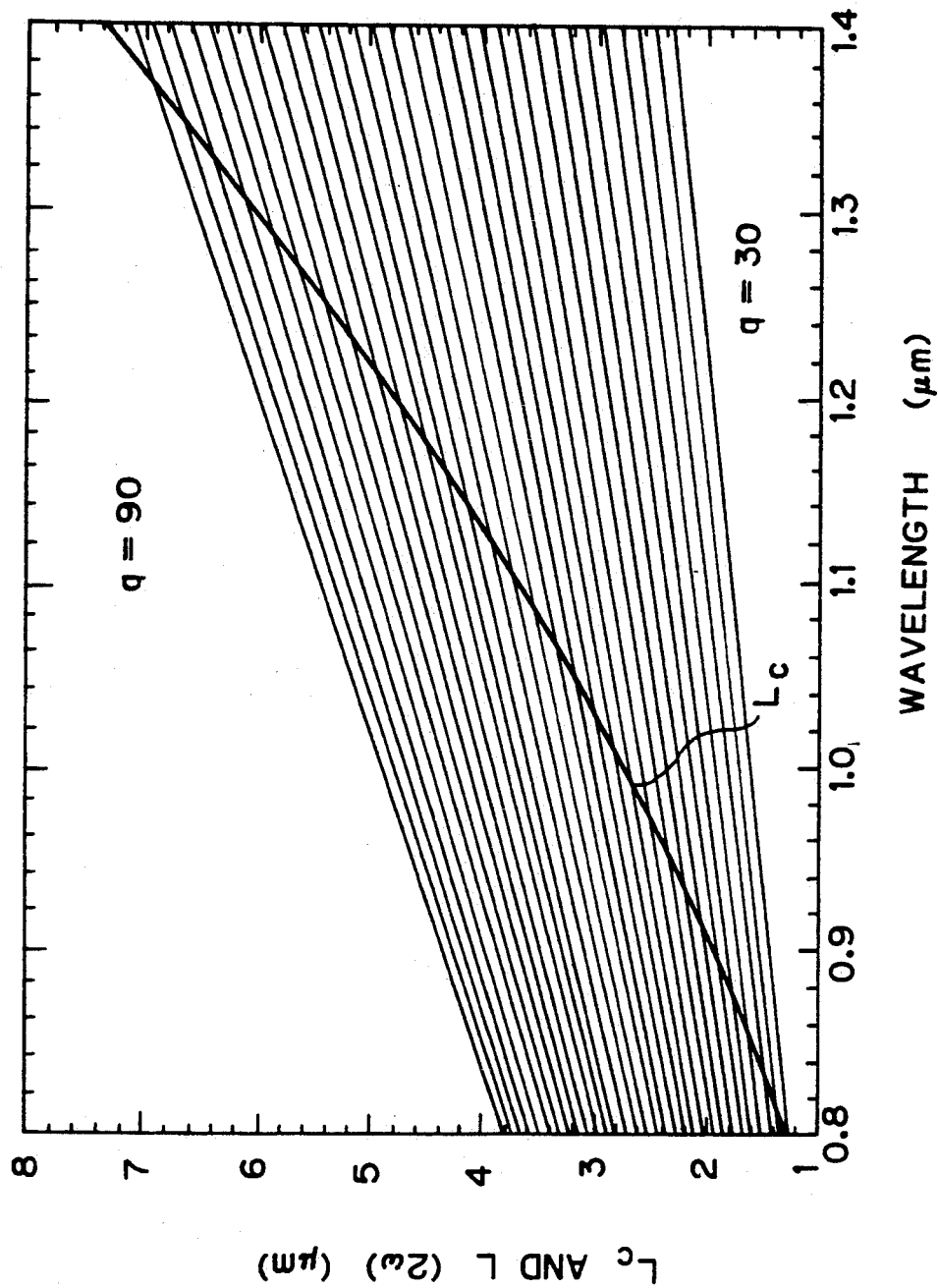
FIG. 7 is a graph illustrating a relationship between wavelengths of a fundamental wave light (fundamental light) and of a second harmonic vs. length Lc which is an odd multiple larger than the coherence length lc and $L(2\omega)$, with the horizontal axis indicating wavelength in microns and the vertical axis indicating $L(2\omega)$ in microns.

Referring to FIGS. 5, 6 and 7, description will be made on the guide index distribution structure. FIG. 5 is a graph illustrating a guide index-wavelength dispersion characteristics of $LiNbO_3$ used as a substrate in the quasi-phase matching element according to the instant embodiment of the present invention, with the horizontal axis indicating wavelength in microns and the vertical indicating the axis guide index. When calculating the guide index-wavelength dispersion characteristics, the following formula after Sellimeier was used, see *Optics Communications*, vol. 17, p. 332 (1976):

$$n2(\lambda) = 4.5820 - \{0.099169/[(0.04432 - \lambda 2)]\} - 0.021 - 950\lambda 2$$

FIG. 6 is a graph plotting a relationship between wavelength of a fundamental wave light (fundamental light) vs. length Lc which is an odd multiple larger than the coherence length lc and $L(\omega)$, with horizontal axis indicating wavelength and the vertical axis giving $L(\omega)$ both in microns. FIG. 7 is a graph in which is plotted a relationship between wavelengths of a fundamental wave light (fundamental light) and of a second harmonic, vs. length lc which is an odd multiple larger than the coherence length lc and $L(2\omega)$, with horizontal axis indicating wavelength and the vertical axis giving $L(2\omega)$ both, in microns.

In the following description, the guide indices $n(\omega)$ and $n(2\omega)$ of $LiNbO_3$ are replaced by effective indices $N(\omega)$ and $N(2\omega)$ of the optical waveguide since the fundamental light and second harmonic propagate in the optical waveguide formed on the substrate. It should be noted that this replacement of guide indices will make no difference in the essence of explanation on the periodical structure.

The effective guide indices $N(\omega)$ and $N(2\omega)$ are guide indices for extraordinary lights since only extraordinary lights can propagate in the optical waveguide formed by the proton exchange method. Here, the direction of vibration of an electric field component of an extraordinary light is substantially perpendicular to the +C surface of the $LiNbO_3$ substrate.

In the instant embodiment of the present invention, the period Λ of variation of guide index satisfying the aforementioned three conditions:

(i) it has a reflecting effect on fundamental light $\lambda(\omega)$;
(ii) it has a transmitting effect on SH light $\lambda(2\omega)$; and
(iii) it satisfies quasi-phase matching conditions, is obtained and a periodical guide index distribution structure is formed at this period Λ.

If the period Λ satisfying the three conditions exists, light returned from the quasi-phase matching element 50 enters the LD chip 30 to cause the lasing of the LD chip 30 to launch a laser light therefrom which is used as a fundamental wave light for the quasi-phase matching element 50, thus emitting from the quasi-phase matching element 50 a second harmonic efficiently with its light intensity increasing for every coherence length.

The aforementioned three conditions can be expressed by the following general formulae:

Condition of reflection of the fundamental light:

$$\Lambda/2 = L(\omega) = p\lambda(\omega)/4N(\omega) \quad (3)$$

Condition of transmission of the second harmonic:

$$\Lambda/2 = L(\omega) = (2q-1)\lambda(\omega)/8N(2\omega) \quad (4)$$

Condition of quasi-phase matching:

$$\Lambda/2 = Lc = (2s-1)\lambda(\omega)/4\{N(\omega) - N(\omega)\} \quad (5)$$

in the above formulae, p, q, and s: independent positive integers;
Λ: period of variation of a guide index in a periodical guide index distribution structure;
$L(\omega)$: wavelength of a fundamental wave light in a quasi-phase matching element;
$L(2\omega)$: wavelength of a second harmonic light in a quasi-phase matching element;
Lc: length by an odd multiple larger than the coherence length of a fundamental light in a quasi-phase matching element;
$\lambda(\omega)$: wavelength of a fundamental wave light;
$\lambda(2\omega)$: wavelength of a second harmonic light;
$N(\omega)$: effective guide index of an optical waveguide for a fundamental wave light; and
$N(2\omega)$: effective guide index of an optical waveguide for a second harmonic light.

If the period Λ satisfying the aforementioned formulae (3) (4) and (5) simultaneously is obtained and a quasi-phase matching element is formed in accordance therewith, it is expected that a self quasi-phase matching can be achieved. Here, by the term "self quasi-phase matching method" is meant a quasi-phase matching method in which lasing is performed with light fed back from a quasi-phase matching element with suppressing lasing by a laser device by itself giving a fundamental wave light source to thereby obtain a fundamental light automatically satisfying quasi-phase matching conditions and achieve quasi-phase matching. Based on formulae (3) (4) and (5) above, relationships between the wavelength of the fundamental wave light and LC and $L(\omega)$ were obtained and results as shown in FIGS. 6 and 7 were obtained.

In FIG. 6, there are shown a group of curves satisfying conditions of reflection of a fundamental wave corresponding to from p=10 to p=50 and a curve corresponding to s=1 (indicated here also by Lc). From the results a candidate value for achieving self quasi-phase matching can be obtained by extracting intersections of the group of curves satisfying the reflection conditions and the curve Lc.

On the other hand, in FIG. 7, there are shown a group of curves satisfying conditions of transmission of second harmonic corresponding to from q=30 to q=90 and a curve corresponding to s=1 (indicated here also by Lc). To note, in FIG. 7, values of q are indicated for every other curve. From the results a candidate value for achieving self quasi-phase matching can be obtained by extracting intersections of the group of curves satisfying the reflection conditions and the curve Lc.

The aforementioned results relate to the case of s=1. Since s takes a number of positive integers varying s=1, 2, 3, and so on, a number of curves for Lc can be drawn. Therefore, there are numerous intersections of curves for the reflection conditions and curves for transmission conditions. Accordingly, if a value is obtained which coincides with the period $\Lambda$ or an approximate value in the range where there occurs no optical trouble, then that period $\Lambda$ can be used as the period satisfying the three conditions described above.

Then, a more specific description will be made on period $\Lambda$ for a case where an AlGaAs semiconductor laser is used and the wavelength $\lambda(\omega)$ of the fundamental wave is set up at 830 nm. Assuming the effective guide indices of the optical waveguide for a wavelength $\lambda(\omega)$ of a fundamental wave and a wavelength $\lambda(2\omega)$ for second harmonic are $N(\omega)$ and $N(2\omega)$, respectively, the following values can be obtained as will be calculated from the results shown in FIG. 5:

$N(\omega)=2.1727$; and $N(2\omega)=2.3139$

Here, substitution of p=15, q=33 and s=1 into formulae (3) (4) and (5) with an assumption that the period of the reflection condition represented by formula (3) is $\Lambda 1$ gives $\Lambda\tfrac{1}{2}=L(\omega)=1.4325$ μm.

Assuming that the period of the transmission condition represented by formula (4) is $\Lambda 2$, $\Lambda 2/2=L(2\omega)=1.4572$ μm.

Assuming that the period of quasi-phase matching condition represented by formula (5) is $\Lambda 3$, $\Lambda 3/2=Lc=1.4695$ μm.

Thus, the periods $\Lambda 1$, $\Lambda 2$ and $\Lambda 3$ obtained from the respective formulae can be deemed as substantially coinciding with each other.

In another example where p=46, q=99 and s=2 with an assumption that the periods of reflection, transmission and quasi-phase matching conditions are $\Lambda 1$, $\Lambda 2$ and $\Lambda 3$, respectively, $\int\tfrac{1}{2}=4.3932$ μm,
$\Lambda 2/2=4.4165$ μm, and
$\Lambda 3/2=4.4085$ μm.

Those values can be deemed as substantially coinciding with each other in the range optically giving no trouble.

In the former example in which p=15, q=33 and s=1, if the period $\Lambda$ is set up to $\Lambda=2.9$ μm, the LD chip 30 generates a laser beam having a wavelength near $\lambda(\omega)=0.38$ μm. This wavelength satisfies the quasi-phase matching condition in the quasi-phase matching element 50. The quasi-phase matching element 50 efficiently generates a second harmonic light using the laser beam at this oscillation wavelength as a fundamental wave light, with the second harmonic light being emitted from the quasi-phase matching element 50 at an increased light intensity and at a high power with substantially no reflection. In the latter case in which p=46, q=99 and s=2, a high power second harmonic light is emitted similarly to the former case.

In the configuration shown in FIG. 2, the second harmonic generator includes the LD chip 30 and SHG element 50 arranged in such a manner that the fundamental light can enter substantially perpendicularly to the first element end 58. Therefore, there is a high possibility that a reflected light from the first element end 58 reenters the LD chip 30, and there is a fear that sometimes the oscillation conditions of the laser diode cannot be determined by the HR coating surface (the first chip end) 34 and the period $\Lambda$ of the guide index distribution structure alone. Furthermore, it is difficult to coat a antireflection film on the first and second element ends 58 and 60 of the SHG element 50. Fortunately, however, it is easy to polish ends of a crystal substrate made of LiNbO$_3$, for example.

Hence, in order to prevent the light reflected on the first element end of the SHG element from returning to the LD chip, it is sufficient to set up an incident angle of the fundamental light from the LD chip into the optical waveguide of the SHG element at the Brewster angle on the first element end. If the fundamental wave light incident into the quasi-phase matching element (SHG element) and SH light satisfy the aforementioned three conditions (i), (ii) and (iii), i.e., if there exists a period $\Lambda$ satisfying formulae (3), (4) and (5) indicated above, then self quasi-phase matching can be achieved.

Figure 1:
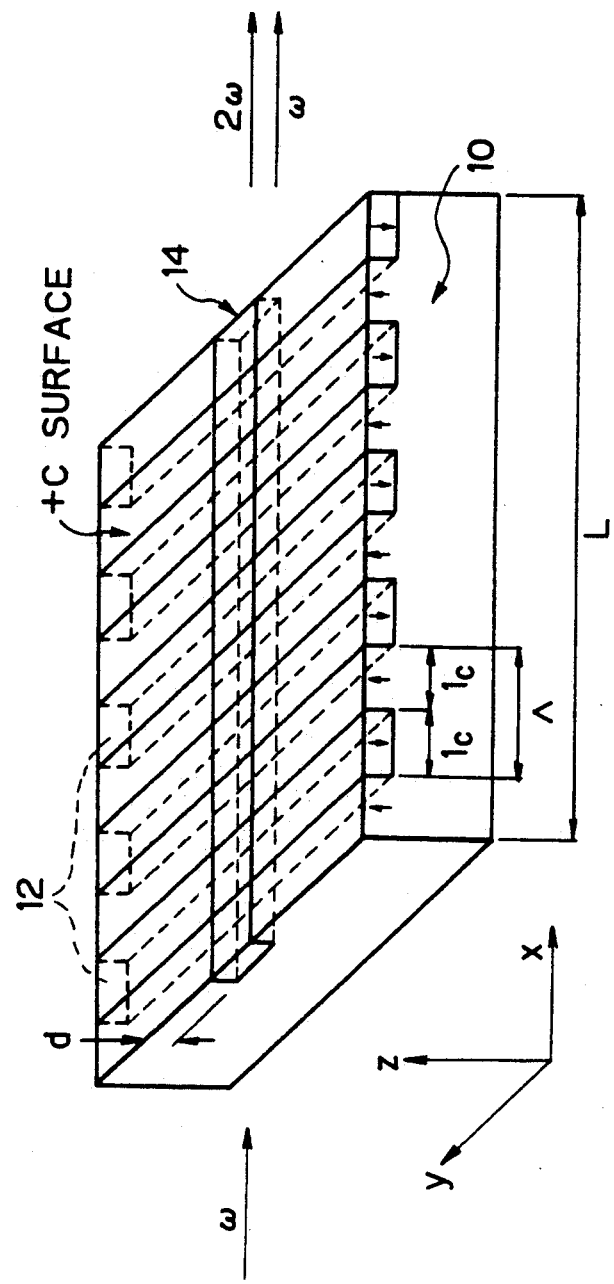
FIG. 1 is a schematic perspective view of a second harmonic generating element, useful for understanding the principle of operation of the second harmonic generating element.
Figure 8:
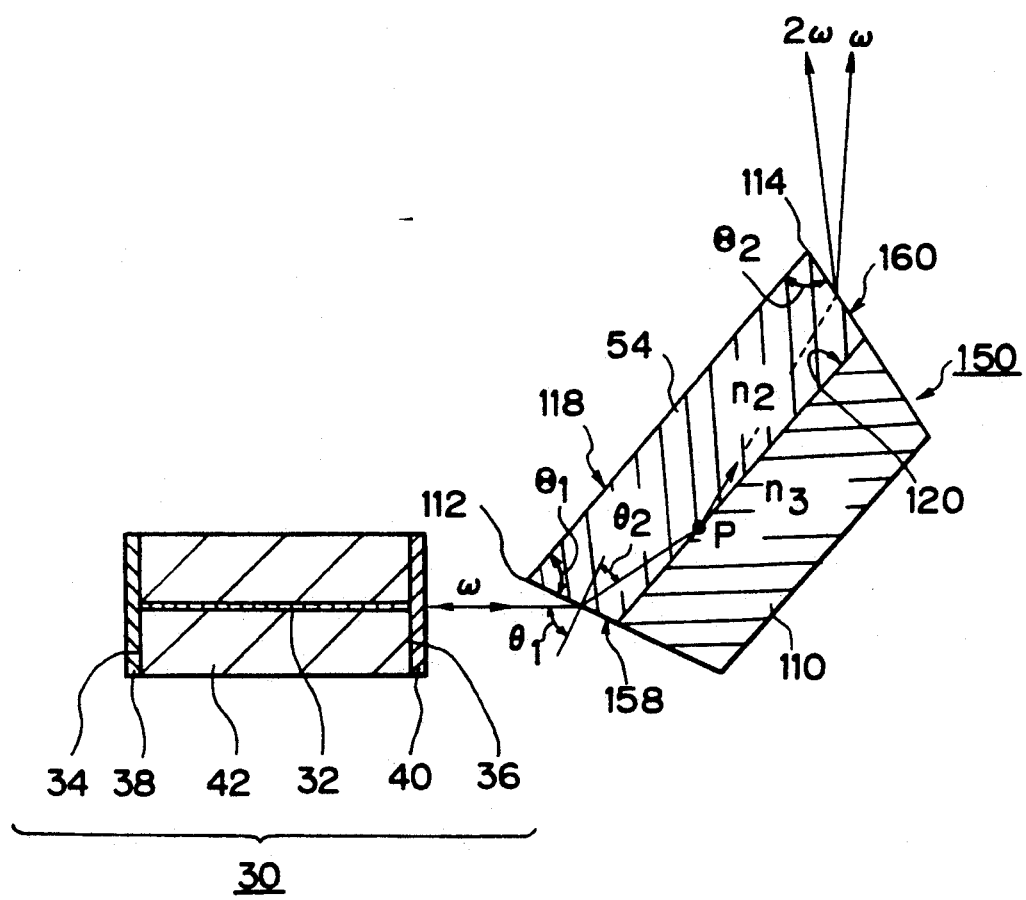
FIG. 8 is a schematic cross sectional view of a second harmonic generator according to another embodiment of the present invention, showing an arrangement of an SL chip and an SHG element corresponding to one shown in FIG. 2.
Figure 9:
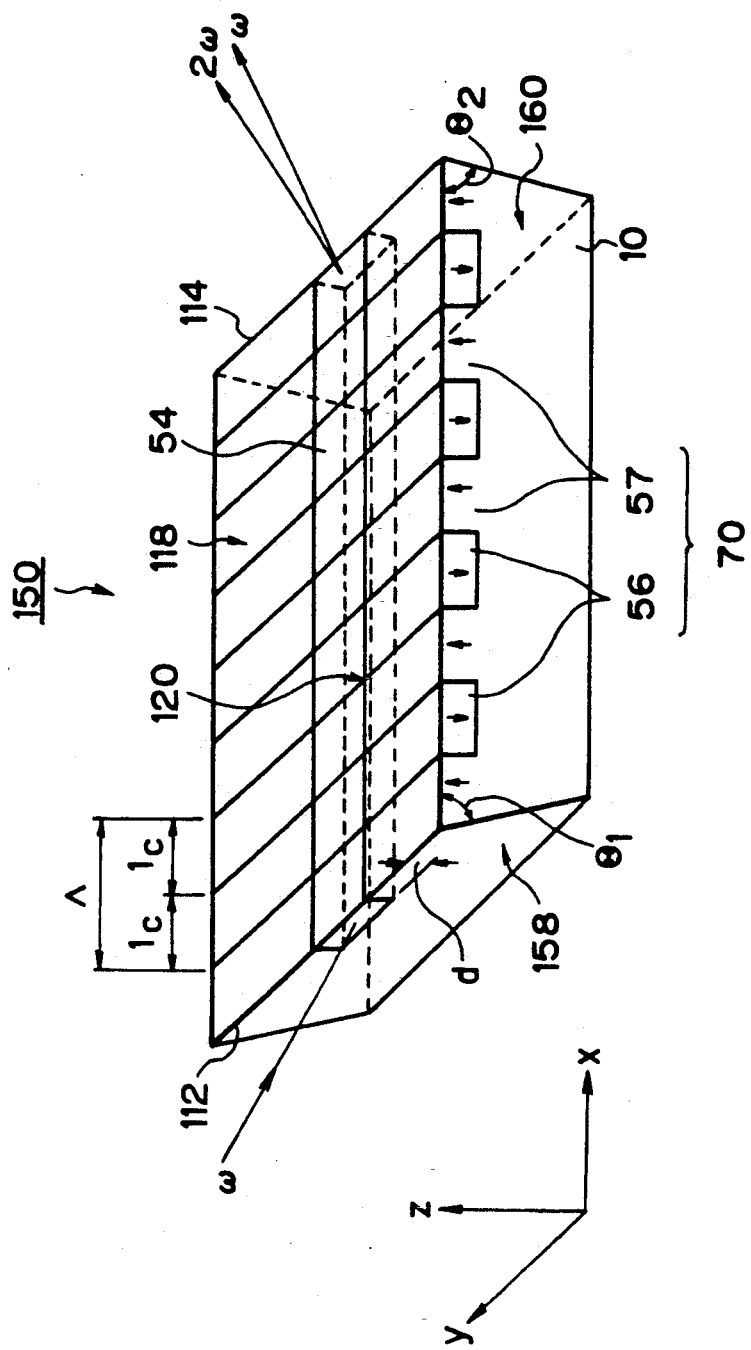
FIG. 9 is a schematic perspective view of a second harmonic generating element corresponding to one shown in FIG. 1, illustrating its construction.

Hereafter, discussion will be made of an embodiment in which the incident angle of a fundamental light is set up at the Brewster angle referring to FIGS. 8 and 9. FIG. 8 is a schematic cross sectional view of a second harmonic generator according to another embodiment of the present invention, showing an arrangement of an LD chip and an SHG element corresponding to one shown in FIG. 2. FIG. 9 is a schematic perspective view of a second harmonic generating element corresponding to one shown in FIG. 1, schematically illustrating its specific construction. The LD chip and SHG element themselves used in the instant embodiment are the same in construction as the LD chip 30 and the SHG element 50 used in the arrangement shown in FIG. 2 and the like components are designated by the same reference numerals and detailed description thereon is omitted here but differences in the construction therebetween will be described in the main.

First, the arrangement shown in FIG. 8 differs from the construction shown in FIG. 2 in the following points:

1) The LD chip 30 and the SHG element 50 are arranged so that the fundamental wave light from the SL chip 30 can be incident into the optical waveguide 54 of the SHG element 150 at the Brewster angle or at an angle approximate thereto;

2) The first and second ends 158 and 160 of the SHg element 150 are not covered with a low reflection coating film; and 3) Interior angles $\Theta 1$ and $\Theta 2$ between the first and second element ends 158 and 160, respectively, and the +C face (surface) of the crystal substrate 118 are not 90°. The interior angles Θ1 and Θ2 may be either Θ1=Θ2, or Θ1≠Θ2. In a specific case where Θ1=Θ2=Θ=90° which is possible, the item (3) above should be disregarded.

In the following description, a crystal substrate 110 is a LiNbO$_3$ substrate and its surface 118 is +C face (also referred to as Z face). First, a brief description will be made of an SHG element 150. In the embodiment shown in FIG. 9, the first element face 158 which is the incident and emerging end of a fundamental wave light is inclined relative to the +C face 118 at an interior angle of Θ1(<90°), and the second element end 160 serving as an emerging face for SH light is similarly inclined relative to the +C face 118 at an interior angle of Θ2 (<90°). Particularly, in the embodiments shown in FIGS. 8 and 9, Θ1=Θ2.

The first and second element ends 158 and 160 are formed by polishing the substrate 100. Edges 112 and 114 formed between the first and second element ends 158 and 160, respectively, and the +C face 118 are parallel to each other.

In the same manner as the SHG element in the embodiment shown in FIG. 2, the optical waveguide 54 extends in a surface region of the +C face 118 between the first and second element ends 158 and 160. The direction of extension (X direction) is substantially perpendicular to the edges 112 and 114. An interface 120 between the optical waveguide 54 and the remaining LiNbO$_3$ region is parallel to the +C face 118. Therefore, incident light into the SHG element and emerging light from the SHG element exist in the same plane. For the remaining points, the same description as made with reference to FIGS. 1 through FIGS. 4A and 4B will be applicable and will not be repeated here.

In the arrangement shown in FIG. 8, the first element end 158 is inclined relative to the +C face at an inclination angle of Θ1, which enables introduction of a light (fundamental light) emerging from the LD chip 30 on the incident face 158 being the first element end at the Brewster angle θ1 and also propagation of the light (fundamental light) incident into the optical waveguide 54 in the optical waveguide in a guided mode. Conditions therefor are as follows:

$$\theta 1 = \arctan n2 \tag{6}$$

$$\Theta 1 > \arcsin (n3/n2) - \arcsin \{(1/n2)\sin(\arctan n2)\};$$
$$\text{and} \tag{7}$$

$$\Theta < 180° - \arcsin (n3/n2) - \arcsin \{(1/n2)\sin(\arctan n2)\} \tag{8}$$

Here,
n2: guide index of the optical waveguide for the fundamental light;
n3: guide index of LiNbO$_3$ for the fundamental light.

During the step i which the first element end 158 is formed precise wavelengths of the fundamental light and SH light are unknown but it is sufficient to set up the wavelength of the intended fundamental light in the stage of designing the quasi-phase matching element 150 so that the wavelength can satisfy the Brewster condition. More specifically, the Brewster angle θ1 may be set up at several values in the vicinity of an intended wavelength an optimal combination may be chosen in a stage of integrating the LD chip and the SHG element. However, conditions for θ1 are considerably loose and deviation of incident angle θ of the fundamental light from θ1 by a few degrees causes no reflection on the incident and emerging face. That is, of the light from the active layer 32 of the LD chip 30, a light component linearly polarized in a direction substantially parallel to the plane of the figure enters the optical waveguide 54 with substantially no reflection on the first element end.

Of the fundamental light incident into the SHG element 150, light which is not fed back and SH light generated are reflected repeatedly between the interface 120 and the +C face 118 to reach the second element end, i.e., emerging end 160 and emitted therethrough.

Next, referring to FIGS. 8 and 9, a more specific description will be made on the inclination angle Θ1 of the incident and emerging end 158 of the quasi-phase matching (SHG) element 150. In FIG. 8, the SHG element 150 is shown as being arranged perpendicular to the +C face 118 of the LiNbO$_3$ substrate 110 and in the direction in which the optical waveguide 54 extends, expressed in cross section in a plane passing through the optical waveguide 54. The SHG element 150 originally has a long distance between the first and second element ends as shown in FIG. 9, but in FIG. 8 it is shown schematically with its length being reduced.

In order for the oscillation conditions of the laser diode to be dependent on only the HR coating surface 34 and the period L of the periodical guide index distribution structure 70, it is necessary that the light reflected at the incident and emerging end 158 of the quasi-phase matching (SHG) element 150 will not be fed back to the LD chip 30. This can be achieved by inclining the incident and emerging end 158 with respect to the substrate surface (+C face) 118 as shown in FIGS. 8 and 9. In this occasion, it is ideal if the fundamental light can be introduced into the optical waveguide 54 without being reflected at the incident and emerging end 158. To achieve this, it is sufficient to set up the incident angle θ at the Brewster angle $f1$. In order for the incident light to propagate in the optical waveguide 54 under this condition, formulae (6), (7) and (8) have to be satisfied.

It is assumed that the incident angle θ satisfies the Brewster condition for the fundamental light. Then, θ=θ1. The LD chip 30 is arranged in FIG. 8 such that the direction of vibration of the electric field of the emerging light or p-polarized light is parallel to the plane of the figure. The fundamental light or p-polarized light enters into the optical waveguide 54 without being reflected at the incident face 158 which is the first element end. The fundamental light and SH light are emitted through the emerging end 160 without being reflected thereon. The s-polarized light is totally reflected at the incident face 158 and will not return to the LD chip 30 side. If there is a slight reflection at the incident and emerging end 158 due to the face that the incident angle θ does not satisfy the Brewster condition strictly or some other reasons, reflected light of the p-polarized light will not return to the LD chip 30. That is, the wavelength of the generated light from the LD chip 30 is determined depending on the HR coating surface 34 and the periodical guide index distribution structure 70 in the optical waveguide 54. In other words, if only the AR conditions of the AR coating surface 40 are met completely, the LD chip 30 and the SHG element 150 can be arranged so that a desired fundamental light can be obtained with adjustment of the incident angle θ by polishing without strict AR coating treatment of the incident and emerging end 158 of the SHG element 150.

Conditions which the interior angle $\Theta 1$ has to satisfy in order to permit the fundamental light satisfying the Brewster condition to propagate or be guided in the optical waveguide 54 are specifically obtained as follows. Here, an example is taken in which the wavelength $\lambda(\omega)$ of the fundamental light is set up at 830 nm. First, it is required that when the fundamental light is guided in the optical waveguide 54, the incident fundamental light which was incident at an incident angle $\theta$ being equal to the Brewster angle $\theta 1$ and entered into the optical waveguide 54 at a refractive angle $\theta 2$ satisfy complete reflection conditions at point P on the interface 120 between the LiNbO$_3$ substrate 100 and the optical waveguide 54. If the conditions are met, the conditions of complete reflection at the +C face, which is an interface between the optical waveguide and air, are automatically satisfied.

Using formulae (6), (7) and (8), conditions for $\Theta 1$ are obtained.

First, $n3 = N(\omega) = 2.1727$.

Guide index n2 increases by proton exchange. Calculation is made with assumption that n2 has increased by about 0.1 based on various data.

$$n2 = N(\omega) + 0.1 = 2.2727.$$

From formula (6), there can be obtained:

$$\theta 1 = \arctan n2 = \arctan 2.2727 = 66.3°.$$

From formula (7), there can be obtained:

$$\Theta 1 > \arcsin 2.1727/2.2727 - \arcsin \{(1/2.2727)\sin(\arctan 2.2727)\} = 49.2°.$$

From formula (8), there can be obtained:

$$\Theta 2 < 180 - \arcsin 2.1727/2.2727 - \arcsin \{(1/2.2727)\sin(\arctan 2.2727)\} = 83.3°.$$

That is, when the wavelength of the fundamental wave is set up at $\lambda(\omega) = 830$ nm, $\Theta 1$ has to be set up in the range of:

$$49.2° < \Theta 1 < 83.3°,$$

in order to satisfy desired conditions.

As discussed above, the embodiment shown in FIG. 8 can realize with ease the quasi-phase matching that was difficult to attain conventionally, thus enabling fabrication of an SH generator with a high conversion efficiency.

As will be apparent from the embodiments shown in FIGS. 1 and 8, the second harmonic generator in acordance with the present invention is of a construction including a semiconductor laser chip and a quasi-phase matching element optically coupled together and capable of realizing second harmonic generation (SHG) by automatically obtaining a wavelength of fundamental wave light which enables quasi-phase matching, i.e. self quasi-phase matching. As a result, in the aforementioned illustrative embodiments, the emerging end of the semiconductor laser chip is provided with a low reflection coating (AR coating) to put it in a state in which the lasing of the semiconductor laser by itself is suppressed and the semiconductor laser is automatically activated by a light fed back from the optical waveguide in the quasi-phase matching element at a wavelength which satisfies the quasi-phase matching conditions of the quasi-phase matching element. The generated laser beam is introduced into the quasi-phase matching element as a fundamental wave light to generate the second harmonic in the quasi-phase matching element.

Also, in the aforementioned embodiments, feedback of a light from the quasi-phase matching element side is realized by the use of a periodical domain inversion structure. In the embodiments described above, the periodical domain inversion structure is formed by diffusing Ti in an optical waveguide provided in a LiNbO$_3$ substrate. The Ti-diffused domain inversion regions have guide indices slightly higher than the guide indices of the non-domain inverted regions (domain non-inversion regions), resulting in that the periodically arranged domain inversion regions form a reflection type diffraction grating, thus coinciding with the periodical guide index distribution structure. The wavelength of a light reflected by the periodical guide index distribution structure is determined by the period of the domain inversion regions. Hence, in the aforementioned embodiments, the period of the inversion structure is determined so as to satisfy the quasi-phase matching conditions and the reflection conditions of the fundamental light as well, thus arranging the quasi-phase matching element and the semiconductor laser chip in optical coupling such that the light fed back from the quasi-phase matching element can be returned into the active layer of the semiconductor laser in order to realize second harmonic generation based on self quasi-phase matching.

Particularly in the embodiment shown in FIG. 2, use is made of a planar type element as the quasi-phase matching element, and the LD chip and quasi-phase matching element are arranged so that the fundamental wave light can enter the first element end at right angles.

In the embodiment shown in FIG. 1, the LD chip and the quasi-phase matching element are arranged so that the fundamental wave light can be incident at the Brewster angle. However, the present invention is not limited to the illustrative embodiments described above and shown in the drawings, and it is obvious to one skilled in the art that various modifications or variations may be made thereto.

For example, the periodical domain inversion structure and the periodical guide index distribution structure may differ from one another and any type of quasi-phase matching element may be used so far as it has a periodical guide index distribution structure in the optical waveguide in contrast to the preceding embodiments in which the both structures coincide with each other.

Although the quasi-phase matching element is made of LiNbO$_3$ crystal in the aforementioned embodiments, KTP instead of LiNbO$_3$ crystal may be used for forming the element.

While the optical waveguide in the quasi-phase matching element is formed by a proton exchange method in the aforementioned embodiments, an optical waveguide formed on a substrate material by any suitable method may be used. In that case, an optical waveguide cannot be formed on a LiNbO$_3$ substrate by the Ti diffusion method because the method gives domain inversion regions throughout the optical waveguide but fails to provide a periodical domain inversion structure.

When a LiNbO$_3$ substrate is used, an optical waveguide may preferably be formed by an Li+-H+ exchange method usually used after the formation of domain inversion regions.

In the above-described embodiments, the domain inversion regions are formed by Ti diffusion on a LiNbO$_3$ substrate but external diffusion of LiO$_2$ may also be used instead of Ti diffusion.

While in the embodiment of the second harmonic generator as shown in FIG. 8, at least the first element end of the quasi-phase matching element is formed as an incident and emerging face by polishing such that it is inclined with respect to the +C face of the substrate at an interior angle Θ1 which is smaller than 90°, the interior angle Θ1 may be 90° if there is a possibility that the incident angle of the fundamental wave light can be set up at the Brewster angle when Θ1=90°. The angle Θ2 of inclination of the second element end serving as an emerging face relative to the +C face is preferably Θ1=Θ2 because the Brewster conditions are met, but it does not have to be necessary that "1=Θ2. In case Θ1≠Θ2, there is no fear that lasing is disturbed with the fundamental wave light of the LD since the light is fed back after repeated reflection in the optical waveguide in the SHG element resulting in increased attenuation although light returning by reflection at the emerging end also exists.

It is also necessary that the fundamental wave light of the SHG element used in the second harmonic generator has a wavelength in the range of gain of the semiconductor laser chip used. While in the aforementioned embodiments, description has been made by setting up the wavelength of the fundamental wave light at 830 nm, fundamental wave lights having other wavelengths can also be generated. In this case, numerical conditions used or obtained in the aforementioned embodiments are varied. Of course such numerical conditions may vary depending on materials used for the substrate of an SHG element and for the optical waveguide. Furthermore, the semiconductor laser chip may be other than a AlGaAs type. For example, InGaAs, InGaAsP or other InAs type semiconductor laser chips.

Figure 10:
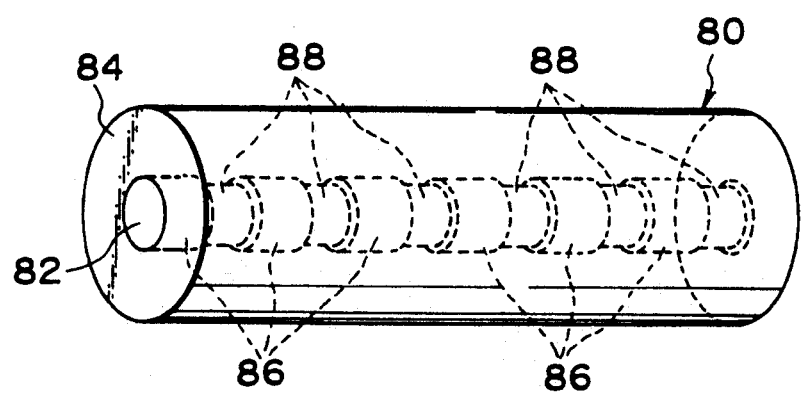
FIG. 10 is a schematic perspective view of a quasi-phase matching element in accordance with another embodiment of the present invention.

In addition, in the embodiment of the second harmonic generator as shown in FIG. 2, description has been made of the use of a planar type quasi-phase matching element. However, this element may also be formed in the form of an optical fiber, with a core serving as an optical waveguide so as to have a structure in which guide index varies periodically (periodical guide index distribution structure) and making higher guide index portions and lower guide index portions to have different diameters from one another. An example of such an optical fiber type of quasi-phase matching element is shown in FIG. 10. In that case, a quasi-phase matching element 80 may be constructed to include, for example, a core 82 made of LiNbO$_3$, a cladding made of suitable material and provided around the core 82 and having a guide index lower than that of the core 82, the core 82 having periodically a higher and a lower guide index regions 86 and 88, thus forming a periodical guide index distribution structure. Preferably, the lengths of the higher and lower guide index regions, respectively, may be set up at the coherence length or a length that is an odd number multiple of the coherence length. This construction allows the second harmonic to increase period after period (for every 2 lc) in accordance with the difference between the generation efficiency of the second harmonic in the lower guide index region 88 and that of the second harmonic in the higher guide index region 86.

In the construction shown in FIG. 2, a ½ wavelength plate 72 is inserted between the semiconductor laser chip 30 and the quasi-phase matching element 50. The use of the ½ wavelength plate 72 is to realize an efficient introduction of the emerging light from the active layer 32 of the semiconductor laser into the optical waveguide 54 in the quasi-phase matching element 50. However, the plate 72 may be omitted.

The invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as far as fall within the true spirit of the invention.

What we claim is:

1. A second harmonic generator comprising:
   a semiconductor laser chip having an active layer therein acting as a semiconductor laser for a fundamental wave light source for emitting a laser light; and
   a quasi-phase matching element optically coupled to said semiconductor laser chip to allow said semiconductor laser chip to lase utilizing feedback of a light from said quasi-phase matching element;
   said quasi-phase matching element generating a second harmonic light using the laser light emitted from said semiconductor laser chips as a fundamental wave light.

2. A second harmonic generator in accordance with claim 1, wherein said quasi-phase matching element comprises an optical waveguide having a periodical guide index distribution structure.

3. A second harmonic generator in accordance with claim 2, wherein said semiconductor laser chip has a first chip end and a second chip end each of which is capable of emitting a light;
   wherein said second chip end of said semiconductor laser chip is an end on which said semiconductor laser chip is optically coupled with said quasi-phase matching element; and wherein said first chip end of said semiconductor laser chip and said periodical guide index distribution structure of said quasi-phase matching element constitute an external optical resonator for lasing of said semiconductor laser chip.

4. A second harmonic generator in accordance with claim 2, further comprising a structure for lasing of said semiconductor laser chip utilizing feedback of a light from said periodical guide index distribution structure.

5. A second harmonic generator in accordance with claim 1, wherein said semiconductor laser chip has a first chip end and a second chip end each of which is capable of emitting a light;
   wherein said second chip end of said semiconductor laser chip is an end on which said semiconductor laser chip is optically coupled with said quasi-phase matching element; and wherein said first chip end of said semiconductor laser chip has provided thereon a first reflection coating film constituting an external optical resonator for lasing of said semiconductor laser chip; and
   wherein said second chip end of said semiconductor laser chip has provided thereon a second reflection coating film free of contribution to said lasing of said semiconductor laser chip.

6. A second harmonic generator in accordance with claim 2, wherein said periodical guide index distribution structure has a reflection effect on said fundamental wave light.

7. A second harmonic generator in accordance with claim 2, wherein said periodical guide index distribution structure has a transmission effect on said second harmonic light.

8. A second harmonic generator in accordance with claim 2, wherein said periodical guide index distribution structure has a period of variation of a guide index satisfying:
   (i) conditions of quasi-phase matching of said quasi-phase matching element;
   (ii) conditions of reflection of said fundamental wave light; and
   (iii) conditions of transmission of said second harmonic light.

9. A second harmonic generator in accordance with claim 4, wherein said semiconductor laser chip and said quasi-phase matching element are arranged so that said feedback of said light is performed from said optical waveguide to said active layer in said semiconductor laser chip.

10. A second harmonic generator in accordance with claim 1, wherein said quasi-phase matching element comprises a LiNbO$_3$ substrate having a +C surface, an optical waveguide formed on said +C surface of said substrate by a Li+-H+ proton exchange method, and a periodical guide index distribution structure formed in said optical waveguide by Ti diffusion.

11. A second harmonic generator in accordance with claim 8, wherein said condition of quasi-phase matching is $$\Lambda/2 = Lc = (2s-1)\lambda(\omega)/4\{N(\omega) - N(\omega)\},$$

where
s is a positive integer,
$\Lambda$ is a period of variation of said guide index in said periodical guide index distribution structure,
Lc is a length by an odd number as large as a coherence length of said fundamental light in said quasi-phase matching element,
$\lambda(\omega)$ is a wavelength of said fundamental wave light,
$N(\omega)$ is an effective guide index of said optical waveguide for said fundamental wave light, and
$N(2\omega)$ is an effective guide index of said optical waveguide for said second harmonic light.

12. A second harmonic generator in accordance with claim 8, wherein said condition of said quasi-phase matching is $$\Lambda/2 = L(\omega) = p\lambda(\omega)/4N(\omega),$$

where
p is a positive integer,
$\Lambda$ is a period of variation of said guide index in said periodical guide index distribution structure,
$\lambda(\omega)$ is a wavelength of said fundamental wave light,
$L(\omega)$ is odd times of the coherence length for the fundamental wavelength $\lambda(\omega)$, and
$N(\omega)$ is an effective guide index of said optical waveguide for said fundamental wave light.

13. A second harmonic generator in accordance with claim 8, wherein said condition of transmission of said second harmonic light is $$\Lambda/2 = L(2\omega) = (2q-1)\lambda(\omega)/8N(2\omega)$$

where
q is a positive integer,
$\Lambda$ is a period of variation of said guide index in said periodical guide index distribution structure,
$\lambda(2\omega)$ is a wavelength of said second harmonic light,
$L(2\omega)$ is odd times of the coherence length for the wavelength $\lambda(2\omega)$ of said second harmonic light, and
$N(2\omega)$ is an effective guide index of said optical waveguide for said second harmonic light.

14. A second harmonic generator in accordance with claim 1, wherein said quasi-phase matching element has a first element end capable of introduction and emission of said fundamental wave light and a second element end capable of introduction and emission of said second harmonic light, each of said first and second element ends having a second reflection coating film to keep reflection of said fundamental wave light and said second harmonic light to respective predetermined levels.

15. A second harmonic generator in accordance with claim 1, wherein a ½ wavelength plate is inserted between said semiconductor laser chip and said quasi-phase matching element.

16. A second harmonic generator in accordance with claim 1, wherein said active layer of said semiconductor laser chip and said optical waveguide in said quasi-phase matching element are optically coupled with each other.

17. A second harmonic generator in accordance with claim 1, wherein said quasi-phase matching element is of a planar type.

18. A second harmonic generator in accordance with claim 1, wherein said quasi-phase matching element is of an optical fiber type.

19. A second harmonic generator in accordance with claim 1, wherein said semiconductor laser chip is adapted to be used under application of an operation current in a range free of lasing with said semiconductor laser chip alone.

20. A second harmonic generator in accordance with claim 2, wherein said quasi-phase matching element comprises a crystal substrate having +C face as a surface;
   wherein said quasi-phase matching element has a first element end on a side of said semiconductor laser chip, said first element end being capable of introduction and emission of said fundamental wave light, and a second element end opposite to said first element end being capable of introduction and emission of said second harmonic light;
   wherein said optical waveguide extends between said first and second element ends;
   said first and second element ends being inclined at interior angles $\Theta 1$ and $\Theta 2$, respectively, with respect to said +C face; and
   wherein said semiconductor laser chip and said quasi-phase matching element are arranged so that said fundamental wave light can be incident into said optical waveguide at a Brewster angle or an angle approximate thereto.

21. A second harmonic generator in accordance with claim 20, wherein said interior angle Θ1 and Θ2 satisfy Θ1=Θ2.

22. A second harmonic generator in accordance with claim 20, wherein said crystal substrate includes a substrate layer in which material of said crystal substrate remains unchanged;
   wherein said optical waveguide and said substrate layer define an interface therebetween which is parallel to said +C face; and
   wherein said interior angle Θ1 is set up at a value at which said fundamental wave light and said second harmonic light in said optical waveguide is allowed to enter said interface and said +C face at a total reflection angle.

23. A second harmonic generator in accordance with claim 20, wherein satisfied are conditions:

$$\theta_1 = \tan^{-1} n_2;$$

$$\Theta_1 > \sin^{-1}(n_3/n_2) - \sin^{-1}\{(1/n_2)\sin(\tan^{-1} n_2)\};$$
and $$\Theta_1 < 180° - \sin^{-1}(n_3/n_2) - \sin^{-1}\{(1/n_2)\sin(\tan^{-1} n_2)\}$$

where
$\theta_1$ is said Brewster angle,
$n_2$ is a guide index of said optical waveguide for said fundamental wave light;
$n_3$ is a guide index of said material of said crystal substrate for said fundamental light.

24. A second harmonic generator in accordance with claim 20, wherein said interior angle Θ1 satisfies $$49.2° < \Theta_1 < 83.3°,$$

when said fundamental wave light has a wavelength of 830 nm.

25. A second harmonic generator in accordance with claim 20, wherein said first and second element ends and said +C face define respective edges substantially parallel to each other.

26. A method of generating second harmonics comprising the steps of:
   generating a fundamental wave light source via a semiconductor laser chip;
   coupling said light to a quasi-phase matching element;
   allowing said semiconductor laser chip to lase utilizing feedback of light from said quasi-phase matching element; and
   generating a second harmonic light output using said laser light emitted from said semiconductor laser chip as said fundamental wave light.

* * * * *